United States Patent [19]

Shepherd

[11] 4,309,641

[45] Jan. 5, 1982

[54] LINE SCANNING CIRCUIT FOR A TELEVISION RECEIVER

[75] Inventor: John Shepherd, Paris, France

[73] Assignee: Thomson-Brandt, Paris, France

[21] Appl. No.: 107,603

[22] Filed: Dec. 27, 1979

[30] Foreign Application Priority Data

Jan. 9, 1979 [FR] France .................. 79 00420

[51] Int. Cl.³ ............................................. H01J 29/70
[52] U.S. Cl. .................................. 315/408; 315/409
[58] Field of Search .................................. 315/408, 409

[56] References Cited

U.S. PATENT DOCUMENTS

| Re. 29,885 | 1/1979 | Dietz | 315/408 |
| 4,009,426 | 2/1977 | Böhringer | 315/408 |
| 4,104,569 | 8/1978 | Förster et al. | 315/408 |
| 4,186,330 | 1/1980 | Böhringer | 315/408 X |

FOREIGN PATENT DOCUMENTS

| 2524082 | 12/1976 | Fed. Rep. of Germany . |
| 2730012 | 1/1979 | Fed. Rep. of Germany ...... 315/408 |
| 1536025 | 7/1968 | France .................. 315/408 |
| 2207354 | 6/1974 | France .................. 315/408 |
| 2313830 | 12/1976 | France . |
| 2324167 | 4/1977 | France . |

*Primary Examiner*—Malcolm F. Hubler

[57] ABSTRACT

A line scanning or horizontal deflection circuit for a television receiver including a first scanning thyristor controlled by means of a commutating circuit comprising a second thyristor an inductance and a capacitive circuit, fed from a source which is connected to the scanning circuit by means of a further inductance. According to the invention, the gating signal of the first thyristor is derived from the signal available between the inductance and the capacitive network being taken at an output of the line.

6 Claims, 10 Drawing Figures

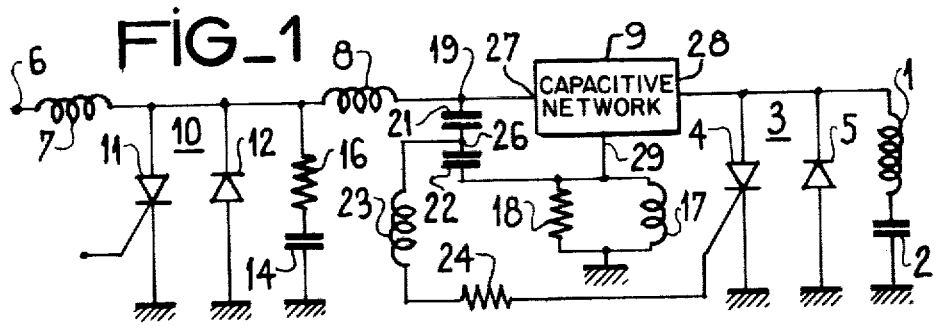
FIG_1
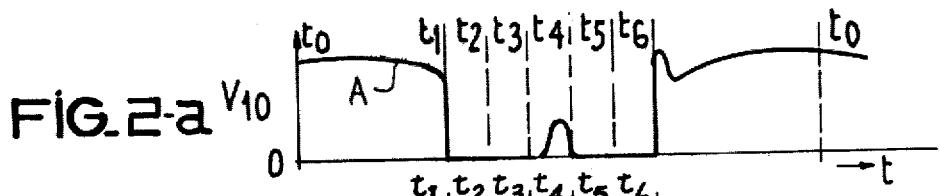
FIG_2-a
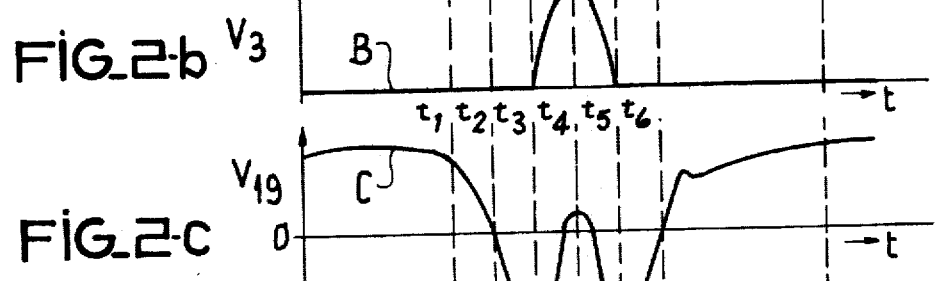
FIG_2-b
FIG_2-c
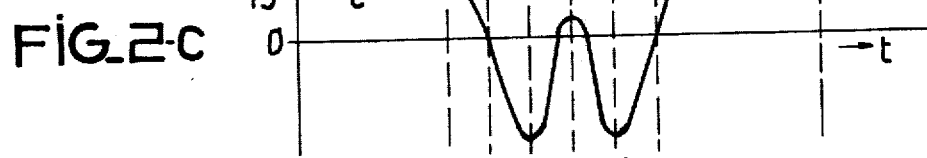
FIG_2-d
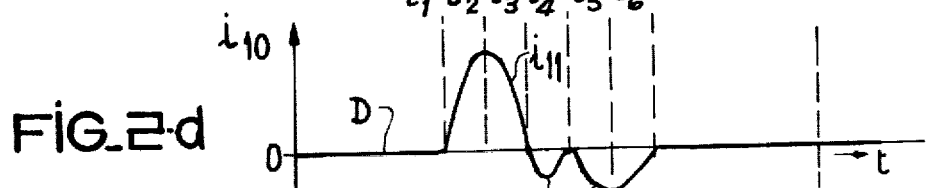
FIG_2-e
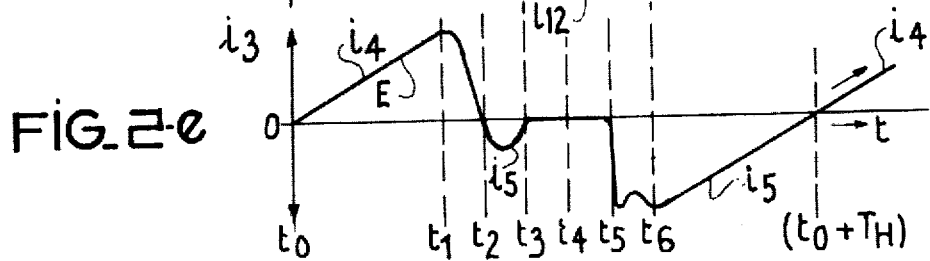

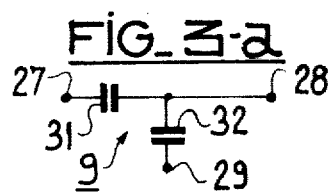
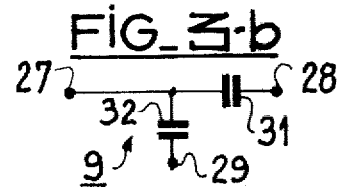
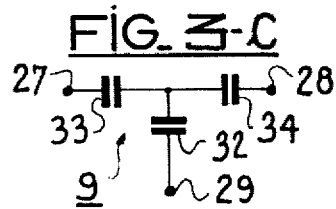
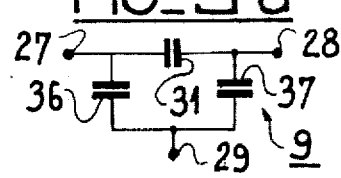
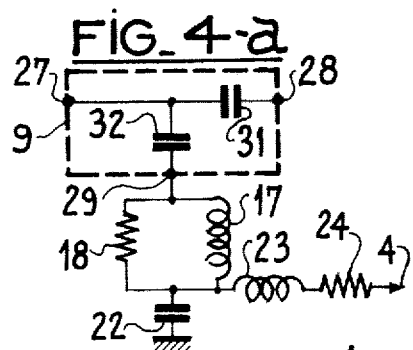
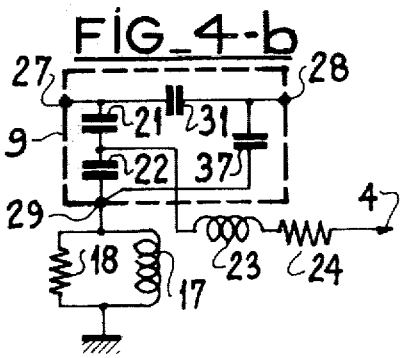
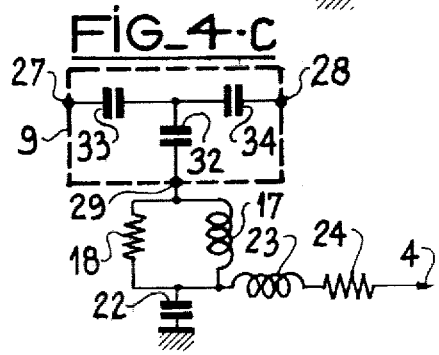
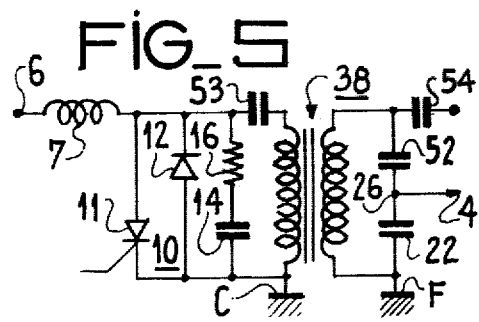

LINE SCANNING CIRCUIT FOR A TELEVISION RECEIVER

BACKGROUND OF THE INVENTION

The invention relates to a line scanning or horizontal deflection circuit for a television receiver, comprising thyristors.

It constitutes an improvement to the circuits described for example in U.S. Pat. Nos. 3,449,623 and 3,906,306.

The basic horizontal scanning circuit comprises essentially: a source, a first switching device including the inductance of the deflector coil mounted in series with a trace capacitor of high capacitance, and a first thyristor-diode pair operating as a scanning switch, and a second switching device including a reactive circuit constituted by an inductance and a capacitive network, and a second thyristor-diode pair causing an oscillating current to pass into the scanning switch, so as to cancel out the current in the first thyristor while ensuring at the same time that the energy is transferred from the source to the scanning coil associated with trace capacitor.

The gate of the second thyristor is coupled to the line or horizontal oscillator of the receiver.

The invention concerns the manner of elaborating the gate signal of the first thyristor operating as a scanning switch.

Several solutions exist at the present moment.

The gate is driven directly by an active circuit, such as the line oscillator (horizontal). In a first solution using a capacitive coupling, it is necessary to have a DC voltage supply of high value (25 volts). In a second solution, in direct connection, a heavily negative DC supply voltage (−25 volts) becomes necessary. At start up it is difficult to rapidly obtain these voltages.

Another solution consists in using the signal across the further inductance connecting the second switching device to the DC supply source. This signal which becomes positive previously to the conduction of the first thyristor becomes negative during the recovery time thereof and the horizontal flyback or retrace periods. The tapping of this signal requires an auxiliary winding coupled to this further inductance connecting the scanning circuit to the supply source. In a variation of this solution an active regulation is used in series with said inductance. But in this case, the voltage available for driving the gate falls to zero during the opening period of the active regulation element, and the operation becomes uncertain.

A third solution consists in using a damping and protection network, formed by a resistor and a capacitor in series, mounted in parallel with the second thyristor-diode pair, this network being intended for protecting the thyristor by reducing the voltage gradient which is applied thereto. The voltage existing at the terminals of the capacitor is then taken to drive the gate of the first thyristor. But then the current required for its opening passes through the resistor mounted in series with the capacitor and, for this reason, the power dissipated therein becomes prohibitive.

It can be seen that all these solutions present different disadvantages: dissipation of energy, sensitivity to the regulation and uncertainty of operation at start up, increase of the number of components.

SUMMARY OF THE INVENTION

The object of the invention is a thyristor line-scanning circuit, which does not present these disadvantages.

In fact, the line-scanning circuit of the invention comprises:

a line deflector coil connected in series with a trace capacitor, a first bidirectional switch comprising a thyristor and a diode mounted head to tail, this first switch being connected in parallel with the unit formed by the line deflector and the trace capacitor, a second bidirectional switch comprising a thyristor and a diode mounted head to tail, and controlled by a signal from a circuit oscillating at the line frequency, a reactive circuit comprising a first inductance in series with a capacitive network, and connecting electrically the junction between the anode of the thyristor and the cathode of the diode of the first switch to the junction between the anode of the thyristor and the cathode of the diode of the second switch, said junction of the second switch being furthermore connected to a DC voltage source through a second inductance, and this second switch allowing when it is in the closed position, an oscillating current to pass into the first switch so as to allow the current in the thyristor of this first switch to be cancelled out and the energy of the source to be transferred to the deflector coil in series with the trace capacitor, and wherein the first switch is controlled at the gate of its thyristor by a signal derived from the signal available at the junction of the first inductance and of the capacitive network of the reactive circuit.

The above and other objects, features and advantages of the present invention will become apparent from the following description, given solely by way of example, when taken in conjunction with the accompanying drawings.

DESCRIPTION OF THE DRAWINGS

FIG. 1 is a simplified diagram of a circuit according to the invention.

FIG. 2 shows the voltage and current diagrams at different points of the preceding circuit.

FIGS. 3a, 3b, 3c and 3d are simplified diagrams of different embodiments of the capacitive network, known per se.

FIGS. 4a, 4b and 4c are partial simplified diagrams of variations of the scanning circuit illustrating the different embodiments of the passive coupling circuit of the gate of the scanning thyristor, according to the invention.

FIG. 5 is another embodiment of the coupling circuit of the gate of the scanning thyristor, when an isolating transformer 38 is used to separate galvanically the scanning or outward circuit from the DC supply source and so from the switching or return circuit.

DESCRIPTION OF THE PREFERRED EMBODIMENTS

The scanning circuit of FIG. 1 comprises a first bidirectional switch device 3, connected in parallel to the scanning circuit properly speaking, which is formed from inductance 1 representing the line deflector coil of the cathode ray tube and an outward scanning capacitor 2, mounted in series, this latter supplying coil 1 during the outward scanning. This outward scanning capacitor 2 has a high capacity so as to maintain during operation of the circuit a substantially constant voltage. The bidirectional switch device 3 formed by a first thyristor 4 - diode 5 pair mounted head to tail, is connected to the terminals of inductance 1 and of capacitor 2 in series, and operates as a scanning switch. A second bidirectional switch device 10 is connected to the first one 3 by means of a reactive circuit formed from an inductance 8 and a capacitive network 9, one terminal 29 of which is connected to ground through a damping network 17,18 and whose different known variations are illustrated in FIGS. 3a, b, c and d. The second switch 10 is preferably formed by a second thyristor 11 - diode 12 pair. When it closes, it causes first of all an oscillating current, from reactive circuit 9, to pass into the first switch 3 so as to control its opening by disabling thyristor 4 then it ensures the transfer of energy from circuit 8,9 to coil 1 and capacitor 2. A high value inductance 7 connects the common point between reactive circuit 8,9 and second switch 10 to source 6. This inductance 7 stores the energy supplied by source 6 during the closing of the second switch 10 and ensures the charging of the capacitive network 9, during its opening. A damper network 14,16 mounted in parallel with the second switch 10 limits the variation gradient of the voltage applied to thyristor 11. This network is essentially formed by a capacity 14 and a resistor 16 mounted in series. The damper network formed by an inductance 17 and a resistor 18 in parallel, which connects terminal 29 to ground, limits the current into the capacitive network 9.

The gate of the second thyristor 11 is controlled in a way known per se by the line oscillator of the receiver (not shown).

According to the invention, thyristor 4 of switch 3 is controlled at its gate by a signal elaborated from the signal available at the junction 19 between inductance 8 and the capacitive network 9. The voltage at point 19 which is high (several hundred volts), is lowered to a value compatible with the control of the thyristor by a capacitive voltage divider 21,22. To delay the peak of the gate current as will be explained further on, there is mounted in series, between the output terminal 26 of the capacitive divider 21, 22 and the gate of thyristor 4, an inductance 23 and a resistor 24.

The general operation of a circuit of this type has been explained, particularly in U.S. Pat. No. 3,449,623. The following explanations relate principally to the driving of the gate of the thyristor 4, concerned by the invention.

FIG. 2 shows waveform diagrams at different parts of the circuit. Curves A, B, C show the voltages respectively at the terminals of switches 10 and 3 and at point 19 of the diagram of FIG. 1. Curves D and E show the current intensities flowing respectively through switches 10 and 3 (positive for thyristors 11 and 4 and negative for diodes 12 and 5).

Time $t_o$ is taken at the moment of reversal of the direction of the current in the scanning inductance 1, i.e. at the moment when thyristor 4 begins to conduct. At time $t_1$ thyristor 11 is turned on, the voltage at its terminal becomes zero, and the reactive circuit 8,9 becomes closed through the two switch devices 10 and 3. The oscillating current flowing in reactive network 8,9 through closed switch 10 is superimposed in thyristor 4 on the current flowing through scanning inductance 1. The voltage at point 19 crosses at time $t_2$ through zero to then become negative, then it rises again in accordance with the period of oscillation of the resonant circuit formed by the reactive circuit 8,9, scanning inductance 1 and device 10. But the maximum relative value of this voltage $V_{19}$ will not reach at time $t_4$ the initial value which it had before thyristor 11 has been turned on. The voltage at point 19 only assumes again its initial value after a second oscillation of an oscillating circuit formed then by the reactive circuit 8,9 and the scanning inductance 1, the current then passing through diode 2 while disabling thyristor 11. Thyristor 4 is reverse biassed from time $t_2$, but it is again subjected to a DC voltage from time $t_3$. The parameters of circuit 8,9 are chosen so that this time $t_3-t_2$ is greater than the recovery time of thyristor 4. The negative bias of the gate of thyristor 4 must begin before time $t_2$ and continue until time $t_5$ at least.

It can be seen that voltage $V_{19}$ at point 19 of the diagram of FIG. 1 (curve C of FIG. 2) can advantageously be used to elaborate the signal for driving the gate of thyristor 4 provided that the positive peak is eliminated in interval $t_5-t_3$, when its anode is positive. This voltage $V_{19}$ is in fact positive from $t_6$ to $t_2+T_H$ (where $T_H$ is a line period) and negative from $t_2$ to $t_6$. However, during this latter interval, at time $t_4$, it may become positive again. However, by using a capacitor network, it is possible to align the voltages and to obtain a negative voltage during the whole of the interval between $t_2$ and $t_6$, despite the rise at time $t_4$. The control circuit feeding the gate of thyristor 4 comprises then a capacitive divider formed by two capacitors 21 and 22 connected in series between point 19 and ground, through a damping network 17 and 18, and whose output terminal 26 situated at the intermediate point between capacitors 21 and 22, is connected to the gate of thyristor 4 through inductance 23 and resistor 24 mounted in series. The value of capacitors 21 and 22 is chosen so as to lower the voltage of point 26 to a value compatible with the control of the thyristor. The function of the inductance 23 and resistor 24 network is to phase shift the divided voltage waveform $V_{19}$ so as to place the peak of the gate current at the most favourable time, i.e. approximately at time $t_o$. The damper network formed by inductance 17 in parallel with resistor 18 does not take part directly in the operation of the driver circuit of the gate but it is necessary for limiting the rise of the current both in the capacitive network 9 and in capacitive divider 21,22.

There exist several embodiments in accordance with the circuit adopted for the capacitive network 9, some configurations allowing a simplification of the circuit.

FIGS. 3a, 3b, 3c and 3d give diagrams of different known configurations of the capacitive network 9. In the circuits of FIGS. 3a and 3b which are the most simple, a single capacitor 31 connects terminals 27 and 28 of the network, whereas a capacitor 32 connects the terminal 29 (so-called ground) to a pole of capacitor 31. In FIG. 3c, terminals 27 and 28 of T network 9 are connected by two capacitors 33 and 34 in series, whereas terminal 29 is connected by a capacitor 32 to the common pole of capacitors 33 and 34. In the circuit of FIG. 3d, terminals 27 and 28 are connected together by a single capacitor 31, each of whose poles is connected to terminal 29 by a capacitor respectively 36 and 37 forming a $\pi$ network 9.

FIG. 4a shows circuitry for the driver circuit of thyristor 4 in accordance with the invention, and adapted to capacitive network 9 of FIG. 3b, remarkable by the presence of a single capacitor 31 between terminals 27 and 28 of capacitive network 9, and a single capacitor 32 between one pole of the capacitor and terminal 29 connected to ground by damper circuit 17,18.

It can be seen in this FIG. 4 a that capacitor 32 of the capacitive network 9 also plays the role of capacitor 21 of the capacitive divider 21,22 of FIG. 1 and that capacitor 22 is inserted between the damping network connected to terminal 29 and ground.

FIG. 4b shows circuitry for the driver circuit adapted to the configuration of the capacitive network shown in FIG. 3d. In this diagram it will be noticed that capacitor 36 is replaced by the two capacitors 21 and 22 of the capacitive divider of FIG. 1.

FIG. 4c shows another embodiment adapted to the T circuitry of the capacitive network 9 illustrated in FIG. 3c, comprising two capacitors 33 and 34 in series between the inputs 27 and 28. In this circuitry, capacitor 32 of the capacitive network 9 is also used as first capacitor of the capacitive divider (21, FIG. 1). This simplified circuitry presents however a slight disadvantage in that the presence of capacitor 33 in this configuration results in increasing the rise of the voltage, at time $t_4$ (curve C, FIG. 2) at the junction of capacitors 33, 34 and 32 and also at the terminals of capacitor 22. Now we saw earlier that it was necessary to avoid a positive rise of this voltage at this time. This restraint requires then capacitor 33 to have a much higher capacity than that of capacitor 34.

The circuit according to the invention also presents a great interest in the case where, in the case of scanning circuit 1, inductance 8 (FIG. 1) is replaced by a transformer. The purpose of this arrangement is principally to electrically insulate the largest part of the circuit from source 6. It can be seen that in the case of such circuitry, it would be contrary to the desired aim to connect, by the driver circuit of the gate of scanning thyristor 4, the part of the circuit which we have applied ourselves to making "cold" to the "hot" part located between the transformer replacing inductance 8, and source 6.

FIG. 5 shows the partial diagram of a scanning circuit comprising an isolating transformer 38 in the place of inductance 8. There is shown in this Figure, particularly transformer 38, capacitors 52,53 and 54 equivalent to capacitors 32, 33 and 34 of the capacitive network 9, which are dispersed, and the control ouptut 26 of the gate of thyristor 4, the rest of the scanning circuit being the same as that shown in FIG. 1. Capacitor 53 is connected here in series with the primary winding of transfomer 38, between one of the terminals thereof and the second switch 10, the other terminal of the primary being connected, with the cathode of the second thyristor 11 and the anode of the second diode 12, to hot ground C formed by the negative pole of source 6. Capacitor 54 is connected to one of the terminals of the secondary winding of transformer 38, whose other terminal is connected to the cold ground F of the television receiver, which is isolated from the mains. The third capacitor 52 of the capacitive network is connected in series with the second capacitor 22 of the capacitive divider and the resulting series circuit is connected to the terminals of the secondary winding. It can be seen that, in the case of capacitor 32 of FIG. 4c, capacitor 52 is used also as first capacitor 21 of the capacitive divider (FIG. 1) formed here by capacitors 22 and 52 whose common point 26 is connected to the gate circuit of thyristor 4.

What is claimed is:

1. A line scanning circuit for a television receiver, comprising:
   a line deflector coil connected in series with a trace capacitor,
   a first bidirectional switch comprising a thyristor and a diode connected head to tail, this first switch being connected in parallel with the unit formed by the line deflector and the trace capacitor,
   a second bidirectional switch comprising a thyristor and a diode connected head to tail, and controlled by a signal from a circuit oscillating at the line frequency,
   a reactive circuit comprising a first inductance in series with a capacitive network, and electrically connecting the junction between the anode of the thyristor and the cathode of the diode of said first switch to the junction between the anode of the thyristor and the cathode of the diode of said second switch, said junction of said second switch being furthermore connected to a DC voltage source through a second inductance, and said second switch allowing when it is in its closed position, on the one hand, an oscillating current to pass into the first switch so as to enable the current in the thyristor of said first switch to be cancelled out and, on the other hand, energy to be transferred from the source to the deflector coil associated with the trace capacitor,
   wherein said first switch is controlled at the gate of its thyristor by a signal derived from the signal available at the junction between said first inductance and said capacitive network of the reactive circuit.

2. The circuit as claimed in claim 1, wherein the control signal for the gate of the thyristor of said first switch is taken at the terminals of a third capacitor of a capacitive divider comprising a second capacitor and said third capacitor in series and being connected between the junction of said reactive circuit and the common junction connected to ground of the cathodes of the two thyristors of said switches.

3. The circuit as claimed in claim 2, of the type in which the capacitive network comprises a fourth capacitor connected between the first and second terminals thereof which are connected respectively to the junction of the reactive circuit to said first switch and a fifth capacitor connected between one of the first and second terminals and a third terminal of the capacitive network which is usually connected to ground, possibly through a damper network comprising a third inductance and a resistor in parallel, wherein the capacitive divider comprises said fifth capacitor of the capacitive network and said third capacitor which is inserted between ground and the third terminal thereof.

4. The circuit as claimed in claim 2, of the type in which the capacitive network comprises a fourth, a fifth and a sixth capacitor mounted in a T network, the fourth one of which is connected between the first and second terminals thereof, the fifth one of which is connected between the first and third terminals thereof and the sixth one of which is connected between the second and third terminals thereof, wherein said fifth capacitor is formed by the second and third capacitors in series of the capacitive divider, the common point of said second and third capacitors being coupled to the gate of the thyristor of said first switch.

5. The circuit as claimed in claim 2, of the type in which the capacitive network comprises a fourth, a fifth and a sixth capacitor connected in a "T network", the fourth and fifth ones of which are connected in series between the first and second terminals thereof and the sixth one of which connects the junction of the fourth one and the fifth one to the third terminal of said network, wherein the capacitive divider comprises said sixth capacitor of said capacitive network and said third capacitor inserted between ground and the third terminal thereof.

6. The circuit as claimed in claim 1, in which said first inductance of said reactive circuit is formed by an isolating transformer, allowing the part of the scanning circuit including the deflector coil and said first switch to be electrically insulated from the DC voltage source, and in which the capacitive network comprises a second capacitor in series with the primary winding of the transformer, a third capacitor in series with the secondary winding of this same transformer and a fourth capacitor connected across the terminals of said secondary winding, wherein said fourth capacitor is formed by a capacitive divider comprising a series circuit of two capacitors connected between the terminals of the secondary winding, the common point of said two capacitors of the series circuit being coupled to the gate of the thyristor of said first switch.

* * * * *